United States Patent
Kurita

(10) Patent No.: US 8,304,870 B2
(45) Date of Patent: Nov. 6, 2012

(54) ELECTRONIC DEVICE, RELAY MEMBER, AND MOUNTING SUBSTRATE, AND METHOD FOR MANUFACTURING THE ELECTRONIC DEVICE

(75) Inventor: Yoichiro Kurita, Kanagawa (JP)

(73) Assignee: Renesas Electronics Corporation, Kawasaki-Shi, Kanagawa (JP)

(*) Notice: Subject to any disclaimer, the term of this patent is extended or adjusted under 35 U.S.C. 154(b) by 0 days.

(21) Appl. No.: 12/929,756

(22) Filed: Feb. 14, 2011

(65) Prior Publication Data

US 2011/0221050 A1 Sep. 15, 2011

(30) Foreign Application Priority Data

Mar. 10, 2010 (JP) .................................. 2010-053698

(51) Int. Cl.
*H01L 23/495* (2006.01)

(52) U.S. Cl. ........ 257/676; 257/666; 257/773; 257/776; 257/787; 257/E23.031; 438/112; 438/123

(58) Field of Classification Search .......... 257/666–677, 257/733–786, 787 M, E23.031–E23.059; 438/111, 112, 123, FOR. 366, FOR. 367, 438/FOR. 377, FOR. 380

See application file for complete search history.

(56) References Cited

U.S. PATENT DOCUMENTS

| | | | |
|---|---|---|---|
| 7,327,038 B2 * | 2/2008 | Kwon et al. | .................. 257/777 |
| 2007/0132102 A1 | 6/2007 | Nishimura et al. | |
| 2009/0321927 A1 | 12/2009 | Nishimura et al. | |

FOREIGN PATENT DOCUMENTS

| | | | |
|---|---|---|---|
| JP | 3-167872 | * | 7/1991 |
| JP | 6-21134 | | 1/1994 |
| JP | 6-326235 | | 11/1994 |
| JP | 2007-158244 | | 6/2007 |
| JP | 2008-34567 | | 2/2008 |

* cited by examiner

*Primary Examiner* — Jasmine Clark

(74) *Attorney, Agent, or Firm* — McGinn IP Law Group, PLLC

(57) ABSTRACT

The relay member is at least partly positioned between the semiconductor chip and lead in the plan view, and metal pieces insulated from one another are arranged on the surface. At least either of the first wire and the second wire has their respective other ends and joined to at least one of the metal pieces arranged on the surface of the relay member. Also, the first wire and the second wire have their respective other ends and joined to each other at that part of the relay member which is between the semiconductor chip and the lead. The foregoing structure is highly reliable and versatile for wire connection.

25 Claims, 10 Drawing Sheets

ELECTRONIC DEVICE, RELAY MEMBER, AND MOUNTING SUBSTRATE, AND METHOD FOR MANUFACTURING THE ELECTRONIC DEVICE

CROSS-REFERENCE TO RELATED APPLICATIONS

The disclosure of Japanese Patent Application No. 2010-53698 filed on Mar. 10, 2010 including the specification, drawings and abstract is incorporated herein by reference to its entirety.

BACKGROUND

1. Field of the Invention

The present invention relates to an electronic device, a relay member, and a mounting substrate, and also to a method for manufacturing the electronic device, which has at least two electronic parts coupled together and is sealed with plastics resin.

2. Description of Related Art

One way of mounting an electronic device, such as semiconductor chip, onto a mounting substrate, such as lead frame, is by connection with wires. The wire-connected electronic device has to be sealed with plastics resin after mounting on a mounting substrate. Unfortunately, the sealing plastics resin tends to bend the connecting wires or make them come into contact with one another during its flow, especially in the case where the connecting wires are long. In order to cope with this difficulty, there has been proposed an idea of diving a single connecting wire into two shorter sections.

According to the disclosure of Japanese Patent Application Publication No. Hei6 (1994)-326235, the foregoing idea is realized by coupling two wires together through a relay member having a wiring pattern formed thereon, thereby shortening each wire necessary for connection.

A structure to achieve the same object as above is also disclosed in Japanese Patent Application Publication No. 2008-34567. It is applicable to a semiconductor device which is composed of first and second semiconductor elements arranged upward one over the other on a substrate such that the second semiconductor element is connected to a relay electrode on the first semiconductor element via a first wire and the relay electrode is connected to the substrate via a second wire.

Japanese Patent Application Publication No. 2007-158244 also discloses an idea of joining two wires together through a relay member whose main surface is made entirely of conductive material, thereby dividing the connecting wire into two shorter sections.

Another disclosure in Japanese Patent Application Publication No. Hei6 (1994)-21134 is concerned with the use of a wire fixing member of insulating material which is placed between the semiconductor chip and the inner lead so that it supports the middle of the connecting wire.

SUMMARY

Unfortunately, the technology disclosed in Japanese Patent Application Publication No. Hei6 (1994)-326235 has the disadvantage of requiring a relay substrate having the wiring pattern which differs from one product to another. In other words, the relay substrate lacks versatility.

Similarly, the technology disclosed in Japanese Patent Application Publication No. 2008-34567 has the disadvantage that the relay electrode for the first semiconductor element has to be designed in compliance with the second semiconductor element. This calls for changes in design of the electrode of the first semiconductor element each time when change is made in the second semiconductor element to be combined with the first semiconductor element. This does not make the first semiconductor element versatile.

The technology disclosed in Japanese Patent Application Publication No. 2007-158244 has a disadvantage of allowing a single relay member to have only one set of relay wires because the main surface of the relay member is made entirely of conductive material despite the fact that one electronic part needs a plurality of wires connected thereto. Therefore, it merely provides one set of wires of divided structure.

The technology disclosed in Japanese Patent Application Publication No. Hei6 (1994)-21134 also has the disadvantage of being unable to tightly bind the wire to the wire fixing member which is made of insulating material.

Thus, the disclosed technologies are hardly able to provide more than one set of wires of divided structure with reliable connection and to provide versatile structure for wire connection.

An aspect of the present invention is directed to an electronic device which comprises a first electronic part having a first external connecting terminal, a second electronic part having a second external connecting terminal, the second electronic part not overlapping with the first external connecting terminal in the plan view, a relay region at least part of which is positioned between the second electronic part and the first external connecting part in the plan view, the relay region having a plurality of mutually insulated metal pieces on the surface thereof, a first wire which has its one end connected to the first external terminal and its other end positioned in the relay region, a second wire which has its one end connected to the second external terminal and its other end positioned in the relay region, a sealing plastics resin that seals the first electronic part, the second electronic part, the relay region, the first wire, and the second wire, wherein at least either of the first wire and the second wire has its other end joined to at least one of the metal pieces, and the other end of the first wire and the other end of the second wire are joined together in the relay region.

The electronic device according to another aspect of the present invention is characterized in that its first and second wires have their respective other ends connected to each other in the relay region and at least either of its first and second wires has its other end connected to the metal piece in the relay region. This structure makes connection between the wire and the metal piece stronger than adhesion between the wire and the insulating material. The result is a high reliability of wire connection.

The electronic device according to the present invention is also characterized in that the relay region has on its surface a plurality of metal pieces which are insulated from one another. This structure permits at least either of the first and second wires to have its other end connected to any part in the relay region. Another advantage of this structure is that even in the case where there are more than one each of the first and second wires and there are more than one each of the connecting part for the first and second wires, the connecting parts do not permit conduction between them because the metal pieces are insulated from one another.

The result is a highly reliable wire connection for more than one set of wires of divided structure and a versatile structure for wire connection.

Still another aspect of the present invention is directed to a relay member for connection with a wire between a first external connecting terminal of a first electronic part and a second external connecting terminal of a second electronic part, the relay member being composed of a substrate at least the surface of which has insulating properties and having a plurality of metal pieces separated from one another which exist on at least part of the surface of the substrate.

Still another aspect of the present invention is directed to a mounting substrate on which a first electronic part is to be mounted, the mounting substrate being comprised of a first mounting region in which the first electronic part is to be mounted, a terminal region which is formed at a place different from that of the first mounting region in the plan view and which has a connecting terminal to be connected to the first electronic part through a wire, and a relay region which is positioned between the first mounting region and the terminal region and has on its surface a plurality of metal pieces insulated from one another.

Yet another aspect of the present invention is directed to a method for manufacturing an electronic device which comprises a step of arranging a first electronic part having a first external connecting terminal and a second electronic part having a second external connecting terminal, the second electronic part not overlapping with the first external connecting terminal in the plan view, a step of forming a relay region between the first external terminal and the second electronic part, the relay region having at least on its surface a plurality of metal pieces insulated from one another, a step of connecting one end of a first wire to the first external connecting terminal, connecting one end of a second wire to the second external connecting terminal, joining at least each of other ends of the first wire and the second wire to at least one of the metal pieces existing in the relay region, and joining the other end of the first wire and the other end of the second wire to each other in the relay region, and a step of sealing with a plastics resin the first electronic part, the second electronic part, the relay region, the first wire, and second wire.

The present invention provides a highly reliable wire connection and a versatile structure for wire connection.

DETAILED DESCRIPTION OF THE PREFERRED EMBODIMENTS

Figure 1:
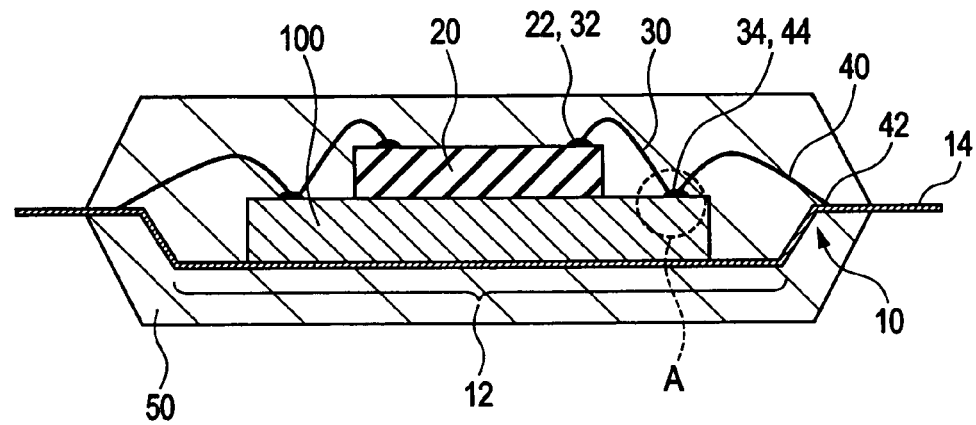
FIG. 1 is a sectional view showing the structure of the electronic device pertaining to a first embodiment.

The embodiments of the present invention will be described below with reference to the accompanying drawings, in which identical constituents are indicated by identical reference numerals without repetition of explanation.

FIG. 1 is a sectional view showing the structure of the electronic device pertaining to the first embodiment. This electronic device is comprised of a first electronic part (lead frame) 10, a second electronic part (semiconductor chip) 20, a relay region (relay member) 100, a first wire 40, a second wire 30, and a sealing plastics resin 50. The lead frame 10 has a lead 14 as a first external connecting terminal. The semiconductor chip 20 does not overlap with the lead 14 in the plan view, and it has an electrode pad 22 as a second external connecting terminal. The relay member 100 has at least part thereof positioned between the semiconductor chip 20 and the lead 14 in the plan view, and it has on surface thereof a plurality of metal pieces insulated from one another. The first wire 40 has its one end 42 connected to the lead 14 and its other end 44 positioned at that part of the relay member 100 which is between the semiconductor chip 20 and the lead 14. The second wire 30 has its one end 32 connected to the electrode pad 22 and its other end 34 positioned at that part of the relay member 100 which is between the semiconductor chip 20 and the lead 14. The sealing plastics resin 50 seals the lead frame 10, the semiconductor chip 20, the relay member 100, the first wire 40, and the second wire 30. At least either of the first wire 40 and the second wire 30 has its other ends 34 and 44 joined to at least one of the metal pieces existing on the surface of the relay member 100. Also, the first wire 40 and the second wire 30 have their respective other ends 44 and 34 joined to each other at that part of the relay member 100 which is between the semiconductor chip 20 and the lead 14. A more detailed description follows.

According to this embodiment, the lead 14 as the first external connecting terminal is formed on the first plane of the lead frame 10 as the first electronic part, and the relay member 100 is placed on the die pad 12 of the lead frame 10. In other words, the relay member 100 is arranged in that region of the first plane of the lead frame 10 which does not overlap with the lead 14 in the plan view.

The relay member 100 is larger in its planar shape than the semiconductor chip 20, and it supports the semiconductor chip 20 thereon. The relay region includes that part of the relay member 100 on which the semiconductor chip 20 is not arranged. According to this embodiment, the relay member 100 has on its entire surface a plurality of metal pieces insulated from one another. Therefore, the relay member 100 permits its entire surface to function as the relay region.

Figure 2:
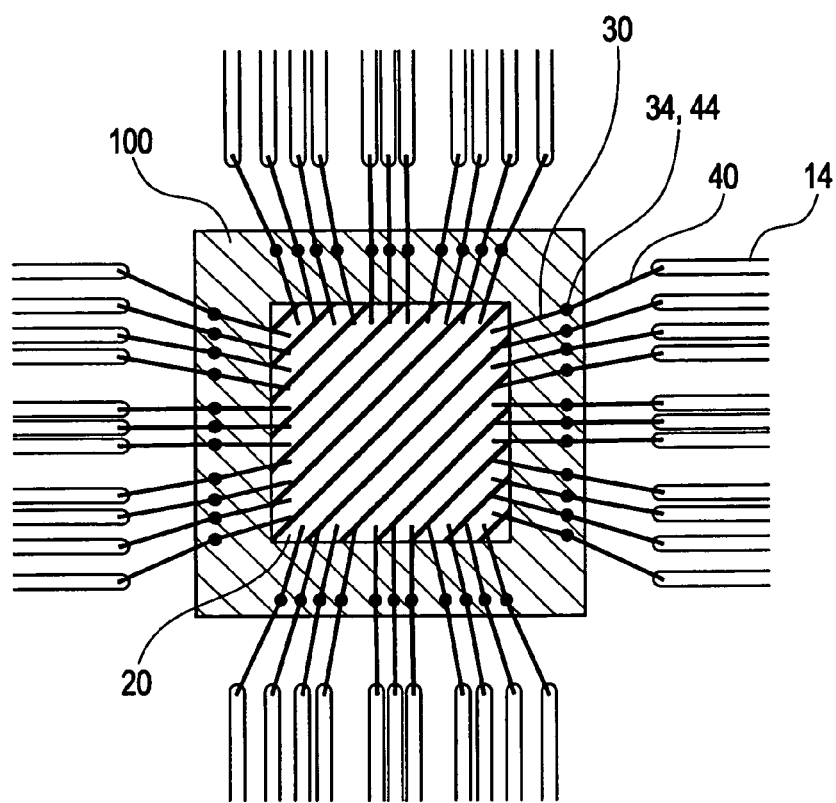
FIG. 2 is a plan view showing the electronic device shown in FIG. 1.

FIG. 2 is a plan view showing the electronic device shown in FIG. 1. The semiconductor chip 20 has a plurality of electrode pads 22, and the lead frame 10 has a plurality of leads 14. FIG. 2 shows an example in which the semiconductor chip 20 has the electrode pads 22 on all of its four sides and the lead frame 10 has the leads 14 in all of the regions opposing the four sides of the semiconductor chip 20. The electrode pads 22 are individually connected to the leads 14 through each of the second wires 30 and the first wires 40. Therefore, a plurality of junction parts are provided for other ends 34 of the second wires 30 and other ends 44 of the first wires 40. These junction parts are individually joined to the metal pieces arranged on the surface of the relay member 100. The metal pieces on the relay member 100 are insulated from one another as mentioned above. Consequently, the junction parts for other ends 34 of the second wires 30 and other ends 44 of the first wires 40 are insulated from one another.

Figure 3:
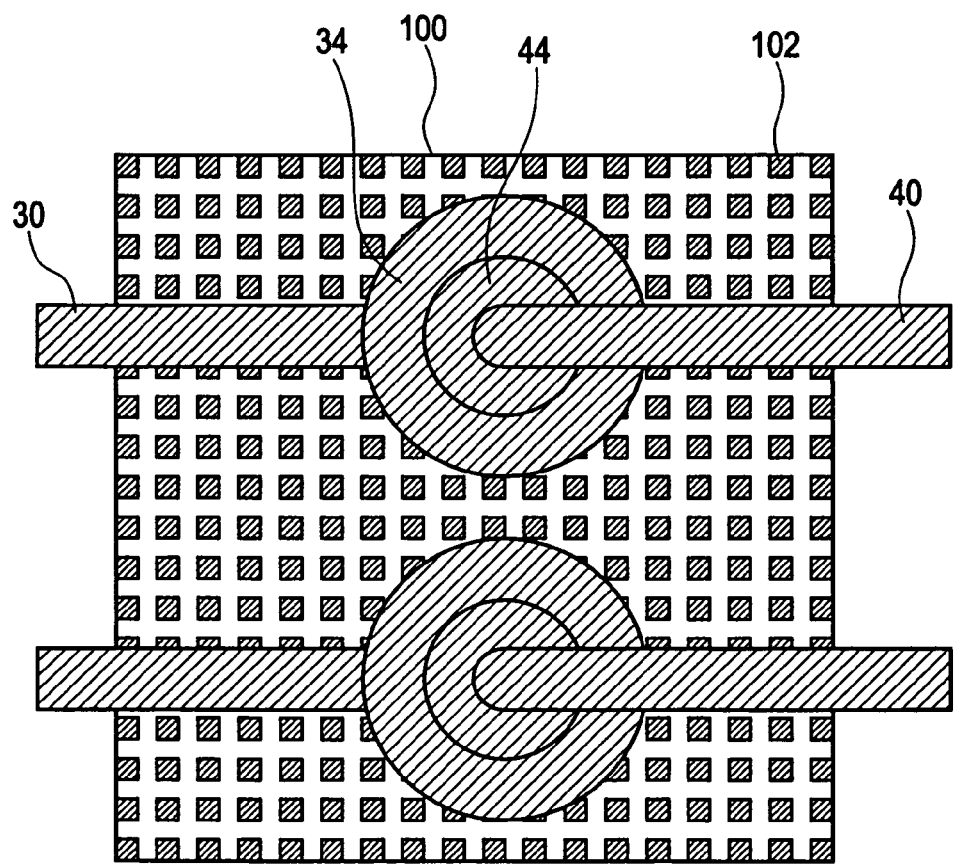
FIG. 3 is an enlarged plan view showing that part of FIG. 1 which is surrounded by a dotted line A.

FIG. 3 is an enlarged plan view showing that part of FIG. 1 which is surrounded by a dotted line A. On the surface of the relay member 100 are a plurality of metal pieces 102 (insulated from one another) forming a dot pattern. The metal pieces 102 are arranged periodically at intervals smaller than the diameter of either of the first wire 40 and the second wire 30. Also, the metal pieces 102 are smaller in size than the diameter of either of the first wire 40 and the second wire 30. Therefore, the interval and size of the metal pieces 102 are smaller than either of the other end 44 of the first wire 40 and the other end 34 of the second wire 30.

In addition, according to this embodiment, the other end 34 of the second wire 30 is joined to the metal pieces 102 and the other end 44 of the first wire 40 is joined to the upper surface of the other end 34 of the second wire 30.

The metal pieces 102 are formed from a metal that becomes alloyed with the second wire 30. It has at least its surface formed from any of Au, Al, Pd, Ag, Sn, and Cu or an alloy containing it as the major constituent, if the second wire 30 is formed from Au, Cu, or Al. The metal or alloy mentioned above easily binds to the first wire 40 and the second wire 30 at the time of their bonding. Good wire bonding is achieved if the surface of the metal pieces 102 is formed from Au or the like (which has a low level of free energy for oxide formation) or Al or the like (which forms a stable oxide film to be broken easily at the time of ultrasonic bonding).

The metal pieces 102 may be a laminate film composed of a Ti layer and an Al layer placed on top of the other. In this case, the Ti layer may be replaced by a TiW layer, and the Al layer may be replaced by an Al alloy layer. Ti or TiW functions as an adhesive metal, and the underlying layer of Ti or TiW causes the metal pieces 102 to firmly adhere to the substrate 104 to be mentioned later.

The metal pieces 102 may be a laminate film composed of a Ti layer, an Ni layer, and an Au layer sequentially placed one over another. In this case, the Ti layer may be replaced by a TiW layer, and the Au layer may be replaced by a Pd layer or a laminate film composed of a Pd layer and an Au layer. Moreover, a Cu layer may be interposed between the Ti layer and the Ni layer. The outermost Au layer or Pd layer permits the first wire 40 and the second wire 30 to firmly adhere to the metal pieces 102. The Ni layer functions as a barrier film to prevent metal diffusion, thereby ensuring the long-term reliability of the junction parts, and it also contributes to good bonding performance due to adequate hardness. The Cu layer also produces the same effect as the Ni layer.

Figure 4A:
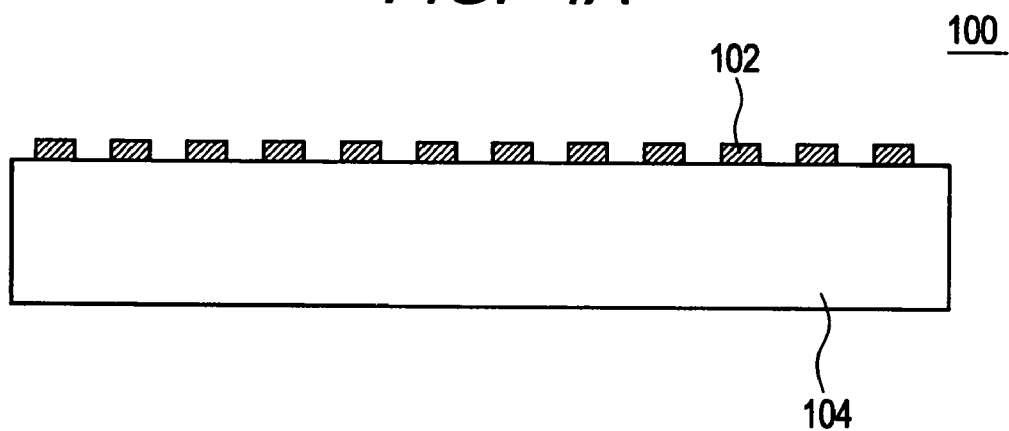
FIGS. 4A and 4B are sectional views each showing the structure of the relay member.
Figure 4B:
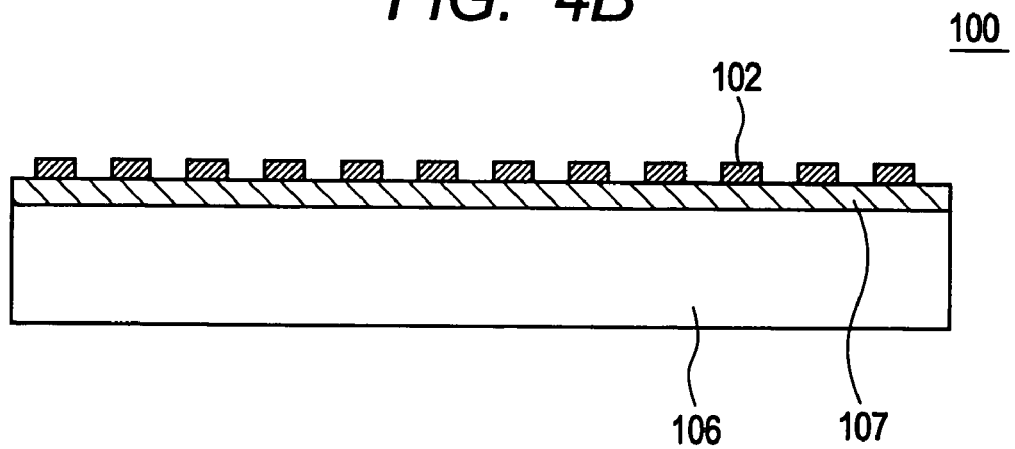

FIGS. 4A and 4B are sectional views each showing the structure of the relay member 100. FIG. 4A shows an example of the relay member 100, which is composed of the insulating substrate 104 and the metal pieces 102 formed thereon. The substrate 104 is that of glass or ceramics, which provides the relay member 100 with good insulating properties and good wiring bonding ability owing to its high hardness. The substrate 104 may also be an organic one made of epoxy resin or polyimide resin. The metal pieces 102 may be formed by selective plating that grows a metal film on the substrate 104. It may also be formed by plating or sputtering that covers the entire surface of the substrate 104 with a metal film, which is selectively removed later.

FIG. 4B shows another example of the relay member 100, which is composed of the conductive or semiconductive substrate 106, the insulating layer 107, and the metal pieces 102. The substrate 106 may be a semiconductive substrate of silicon (Si) or a metal substrate of copper, stainless steel, or Fe—Ni alloy. The Si substrate is readily available as the constituent of semiconductor integrated circuits (IC), and it can be manufactured by the technology employed for IC manufacturing. The metal substrate will reduce the manufacturing cost of the relay member 100. The insulating layer 107 may be a silicon oxide film, silicon nitride film, or insulating resin film, which is formed by thermal oxidation method, CVD method, or coating. The metal pieces 102 may be formed in the same way as that shown in FIG. 4A.

The relay member 100 of either structure shown in FIGS. 4A and 4B may be prepared in the form of large-area sheet, which is subsequently divided into small sheets of adequate size. In this way it is possible to obtain the relay members 100 of any size at one time.

Figure 5A:
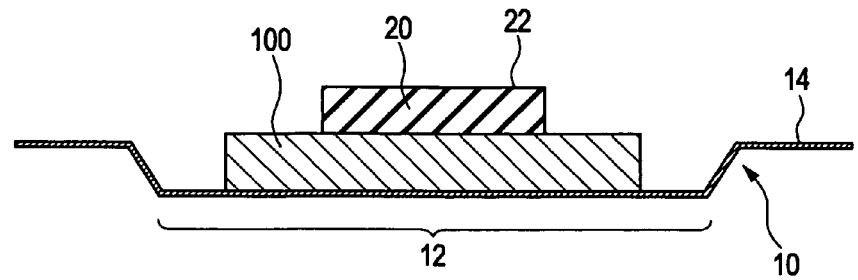
FIGS. 5A and 5B are sectional views showing the method of manufacturing the electronic device shown in FIG. 1.
Figure 5B:
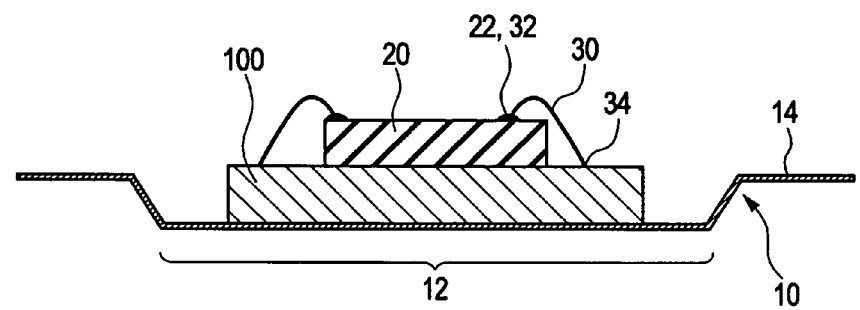
Figure 6:
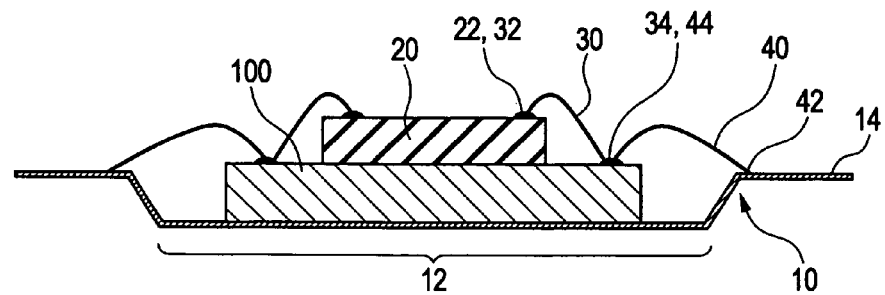
FIG. 6 is a sectional view showing the method of manufacturing the electronic device shown in FIG. 1.

FIGS. 5A and 5B and FIG. 6 are sectional views showing the method of manufacturing the electronic device shown in FIG. 1. As shown in FIG. 5A, the process starts with fixing the relay member 100 on the die pad 12 of the lead frame 10 and then fixing the semiconductor chip 20 on the relay member 100, with its electrode pad 22 facing upward.

In the next step shown in FIG. 5B, one end 32 of the second wire 30 is joined to the electrode pad 22 and the other end 34 of the second wire 30 is joined to any desired part of that region of the relay member 100 which is not covered by the semiconductor chip 20. The second joining takes place as the other end 34 becomes alloyed with the metal pieces 102 (shown in FIGS. 3, 4A, and 4B) on the relay member 100.

In the subsequent step shown in FIG. 6, the other end 44 of the first wire 40 is joined to the surface of the other end 34 of the second wire 30 and then one end 42 of the first wire 40 is joined to the lead 14 of the lead frame 10.

The final step is the sealing of the die pad 12, the lead 14, the relay member 100, the semiconductor chip 20, the second wire 30, and the first wire 40 with the sealing resin 50, as shown in FIG. 1. In this step, the sealing resin 50 would somewhat bend the wires as it flows; however, the amount of bending is limited because the wire that joins the electrode pad 22 of the semiconductor chip 20 to the lead 14 of the lead frame 10 is divided into two shorter sections (the first wire 40 and the second wire 30). This prevents the first wires 40 and the second wires 30 from coming into contact with each other (or prevents adjoining wires from coming into contact with each other) to cause short-circuiting.

The foregoing embodiment performs its function and produces its effect as follows. It is characterized in that the first wire 40 and the second wire 30 have their respective other ends 44 and 34 joined to each other on the surface of the relay member 100, and that the second wire 30 has its other end 34 joined to the metal pieces 102 on the surface of the relay member 100. Therefore, the first wire 40 and the second wire 30 are firmly fixed to the relay member 100, with their respective other ends 44 and 34 joined to each other. This ensures the reliable structure for connection between the first wire 40 and the second wire 30.

The metal pieces 102 exist on the surface of the relay member 100 such that they are insulated from one another. This structure permits the other end 34 of the second wire 30 to be fixed to any part of the relay member 100. Moreover, even in the case where both the first wire 40 and the second wire 30 exist in several numbers and hence they have several joining parts, there is no possibility of conduction across the joining parts because the metal pieces 102 are insulated from one another.

The foregoing structure permits more than one set of divided wires to be arranged with reliable wire connection and makes the relay member 100 versatile.

The fact that the metal pieces 102 are arranged on the surface of the relay member 100 permits the other end 44 of the first wire 40 and the other end 34 of the second wire 30 to join together at any part of the relay member 100. Therefore, the first wire 40 and the second wire 30 can be stretched along a straight line connecting the electrode pad 22 and the lead 14 together no matter how the electrode pad 22 and the lead 14 are laid out. This minimizes the length of the wire connecting the electrode pad 22 and the lead 14 together. The short wire is less vulnerable to bending by the flow of the sealing resin, and this helps the electronic device to improve in electric properties.

Due to the fact that the joining parts for the other end 44 of the first wire 40 and the other end 34 of the second wire 30 can be arranged at any place on the relay member 100, the same effect as above can be manufactured even in the case where the semiconductor chip 20 and the relay member 100 are positioned less accurately.

The metal pieces 102 on the relay member 100 do not need to be specific for individual electronic devices. Therefore, the relay member 100 can be obtained by dividing a preformed large one into a desired size. This reduces the manufacturing cost of the relay member 100.

Figure 7:
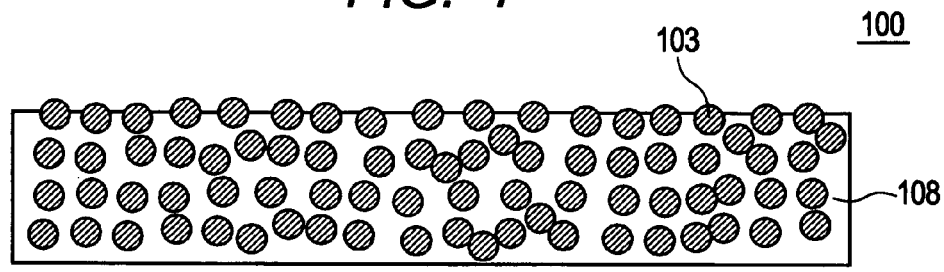
FIG. 7 is a sectional view showing the structure of the relay member used for the electronic device pertaining to a second embodiment.

FIG. 7 is a sectional view showing the structure of the relay member 100 used for the electronic device pertaining to the second embodiment. The electronic device pertaining to this embodiment identical with the one pertaining to the first embodiment except for the structure of the relay member 100.

According to this embodiment, the relay member 100 is composed of the insulating substrate 108 and the metal particles 103 in large number dispersed therein. The metal particles 103 expose themselves at least partly from the surface of the relay member 108. The substrate 108 is made of an insulating plastics resin such as epoxy resin and polyimide resin. The metal particles are those of gold, for example.

Figure 8A:
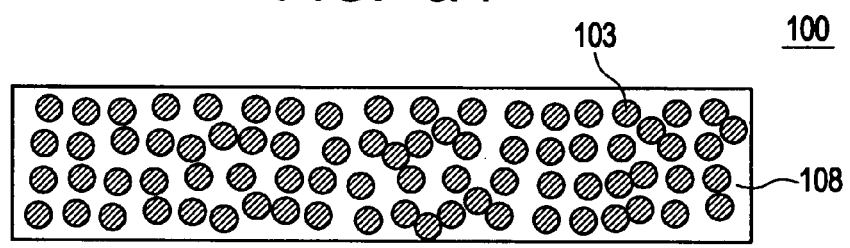
FIGS. 8A and 8B are sectional views showing the method for manufacturing the relay member shown in FIG. 7.
Figure 8B:
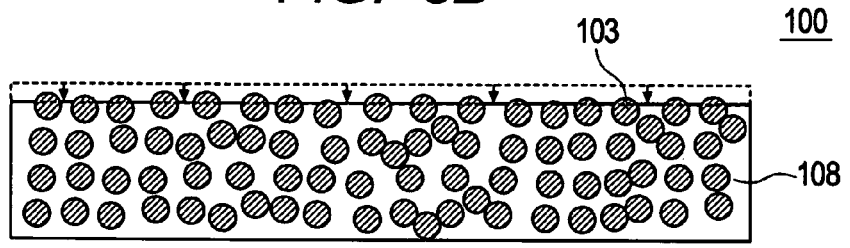

FIGS. 8A and 8B are sectional views showing the method for manufacturing the relay member 100 shown in FIG. 7. The first step shown in FIG. 8A starts with incorporating and dispersing the metal particles 103 into a liquid plastics resin, which is subsequently cured in the form of sheet. Thus, there is obtained the substrate 108 containing the metal particles 103 dispersed therein. The metal particles 103 should be added in such an amount that they are insulated from one another. The substrate 108 (shown in FIG. 8A) resulting from the first step rarely have the metal particles 103 which expose themselves from the surface thereof.

The second step shown in FIG. 8B involves the surface etching of the substrate 108. The surface etching is accomplished by dry etching in such a way that etching proceeds faster in the substrate 108 than the metal particles 103. Thus, the surface of the substrate 108 undergoes etchback and permits the metal particles 103 to expose themselves therefrom. In this way there is obtained the relay member 100.

Figure 9A:
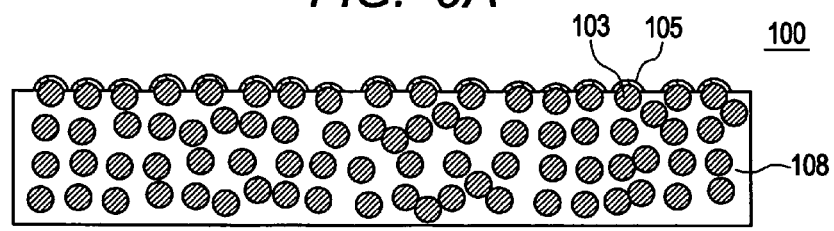
FIGS. 9A and 9B are sectional views showing the relay member shown in FIG. 7 which has been modified.

FIG. 9A is a sectional view showing the relay member 100 shown in FIG. 7 which has been modified. In this modified embodiment, the metal particles 103 are made of Cu or Ni and they have a conductive film 105 covering that part of them which exposes itself from the surface of the substrate 108. The conductive film 105 has an Au layer at least in its outermost surface. Au tends to alloy more easily with the first wire 40 and the second wire 30 than with the metal constituting the metal particles 103. The conductive film 105 may be a laminate one composed of Au layer, Ni layer, and Au layer sequentially arranged one over another or a laminate one composed of Ni layer, Pd layer, and Au layer sequentially arranged one over another. The conductive layer 105 may be formed by performing electroless plating on the relay member 100 in its state shown in FIG. 7. Electroless plating selectively and inexpensively provides the exposed metal particles 103 with the conductive film 105 suitable for bonding.

Figure 9B:
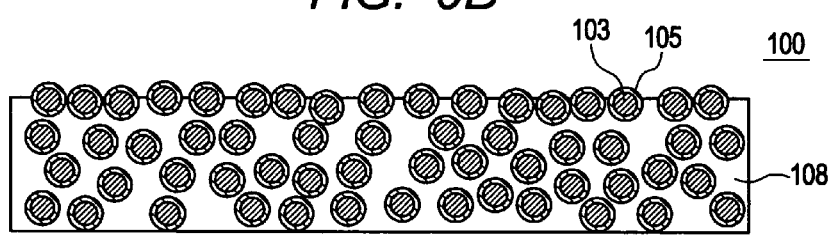

FIG. 9B is a sectional view showing the relay member 100 shown in FIG. 7 which has been modified. In this modified embodiment, the metal particles 103, which have the conductive film 105 formed thereon, are dispersed in the substrate 108. The relay member 100 pertaining to this embodiment is manufactured as follows. First, the metal particles 103 are coated with the conductive film 105. Second, the coated metal particles 103 are incorporated and dispersed into a liquid plastics resin in the same way as mentioned above with reference to FIG. 8A. Third, the plastics resin containing the metal particles 103 dispersed therein is cured in the form of sheet. Finally, the surface of the substrate 108 undergoes etching in the same way as mentioned above with reference to FIG. 8B. According to this modification, the conductive film 105 may be formed by electroless plating before the metal particles 103 are incorporated into the plastics resin.

According to this embodiment, the metal particles 103 function in the same way as the metal pieces 102 in the first embodiment. Therefore, this embodiment produces the same effect as the first embodiment.

Figure 10:
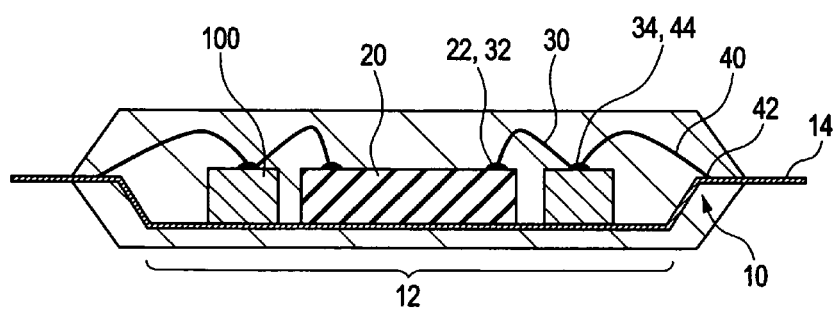
FIG. 10 is a sectional view showing the structure of the electronic device pertaining to a third embodiment.
Figure 11:
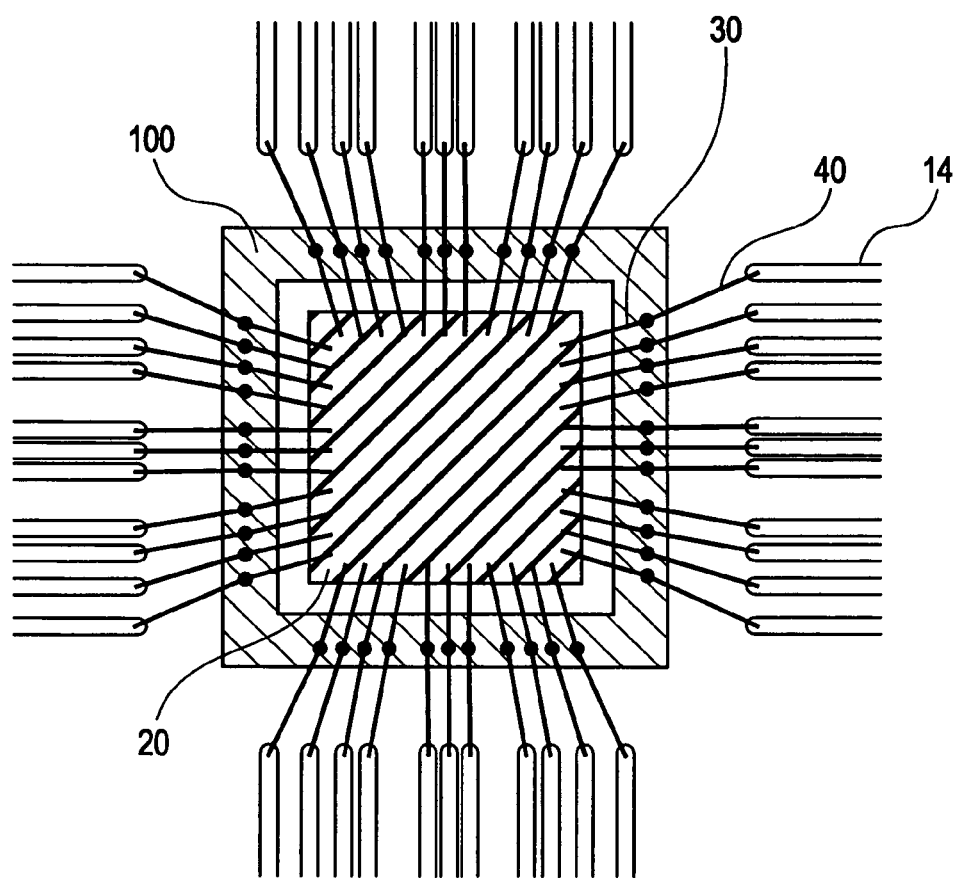
FIG. 11 is a plan view showing the electronic device shown in FIG. 10.

FIG. 10 is a sectional view showing the structure of the electronic device pertaining to the third embodiment. FIG. 11 is a plan view showing the electronic device shown in FIG. 10. The electronic device pertaining to this embodiment is identical with the one pertaining to the first or second embodiment except for what is mentioned below.

The relay member 100 is so shaped as to surround the semiconductor chip 20 in the plan view. It also has a hollow part in the plan view. Both the semiconductor chip 20 and the relay member 100 are fixed onto the die pad 12 of the lead frame 10. To be more specific, the semiconductor chip 20 is fixed on that region of the die pad 12 which is surrounded by the relay member 100. Because of this structure, the relay member 100 is arranged between the semiconductor chip 20 and the lead frame 14.

This embodiment also produces the same effect as the first embodiment. In addition, according to this embodiment, both the semiconductor chip 20 and the relay member 100 are mounted on the die pad 12, and this makes the electronic device thinner.

Figure 12:
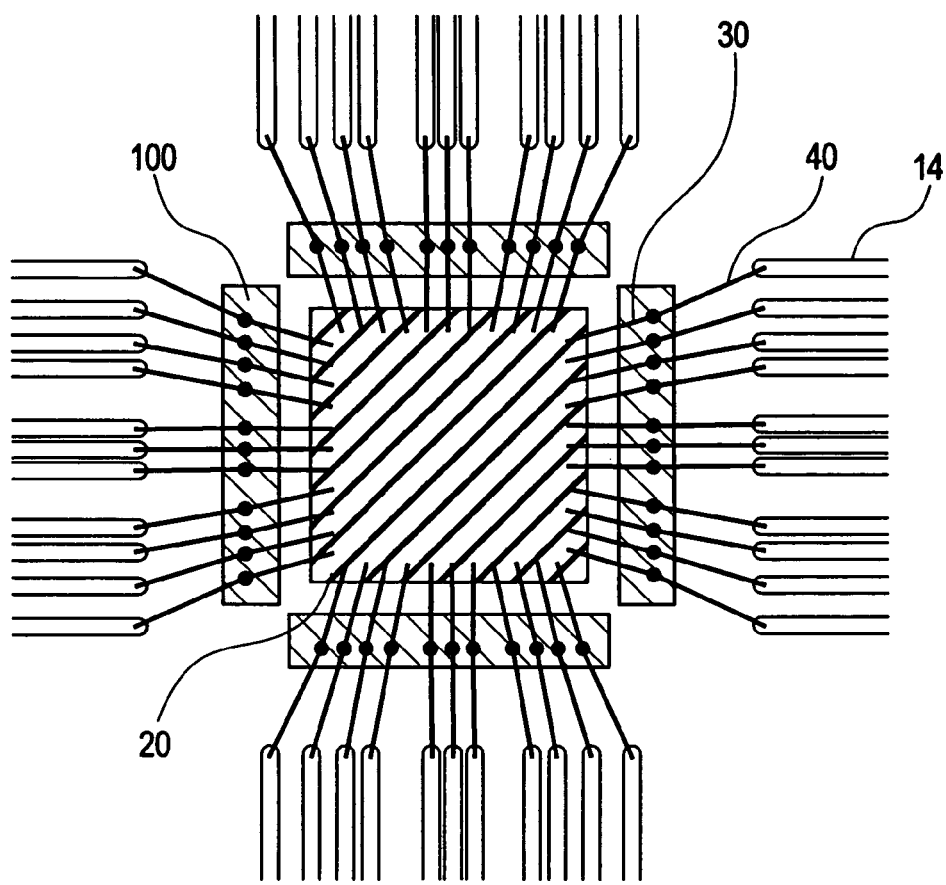
FIG. 12 is a plan view showing the structure of the electronic device pertaining to a fourth embodiment.

FIG. 12 is a plan view showing the structure of the electronic device pertaining to the forth embodiment. The electronic device pertaining to this embodiment is identical with the one pertaining to the third embodiment except for the planar shape of the relay member 100.

According to this embodiment, the relay member 100 has an approximately rectangular planar shape, and there are four units of the relay member 100 between four sides of the semiconductor chip 20 and four units of the lead 14.

This embodiment produces the same effect as the third embodiment. In addition, the fact that the relay member 100 has an approximately rectangular planar shape helps reduce the cost for fabrication of the relay member 100.

Figure 13:
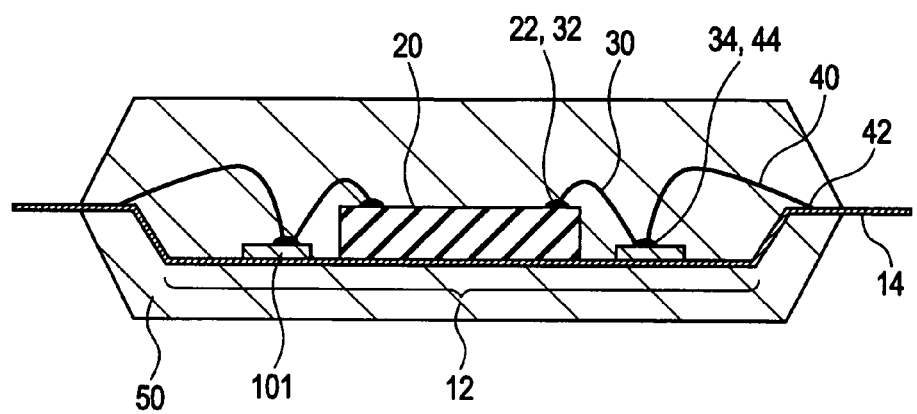
FIG. 13 is a sectional view showing the structure of the electronic device pertaining to a fifth embodiment.

FIG. 13 is a sectional view showing the structure of the electronic device pertaining to the fifth embodiment. The electronic device pertaining to this embodiment is identical with the one pertaining to the third or fourth embodiment except that the relay member 100 is replaced by the relay region 101 which is arranged on the surface of the die pad 12.

The relay region 101 is formed by coating a specific area on the die pad 12 with a plastics resin containing metal particles 103 dispersed therein (see the second embodiment). Moreover, the relay region 101 exists in that region of the lead frame 10 which is held between the lead 14 and that region of the die pad 12 on which the semiconductor chip 20 is mounted. That region of the lead frame 10 in which the lead 14 is provided is one example of the terminal region according to the present invention.

This embodiment produces the same effect as the third embodiment. In addition, the fact that the relay member 100 is not necessary helps reduce the cost for manufacturing of the semiconductor device.

Incidentally, this embodiment may be modified such that the relay region 101 is replaced by the one having the metal pieces 102 as used in the first embodiment. In this case, the metal pieces 102 may be formed together with the lead 14 at the same time when the lead 14 is formed.

Figure 14:
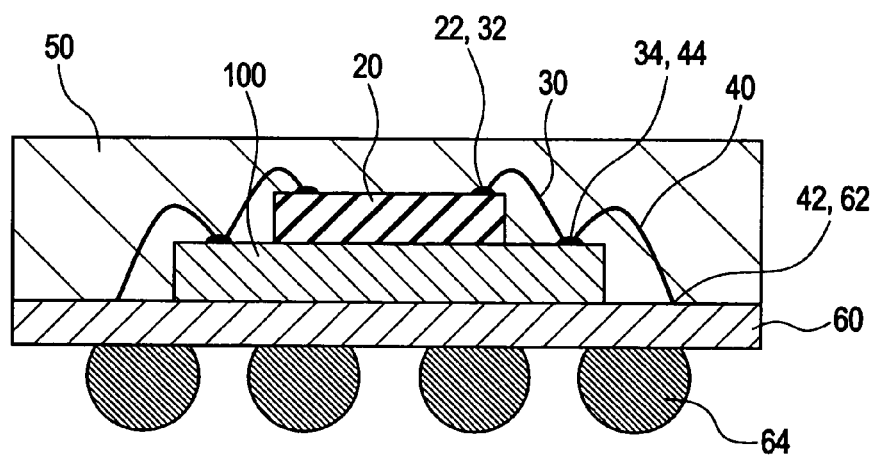
FIG. 14 is a sectional view showing the structure of the electronic device pertaining to a sixth embodiment.

FIG. 14 is a sectional view showing the structure of the electronic device pertaining to the sixth embodiment. The electronic device pertaining to this embodiment is identical with the one pertaining to the first embodiment except that the lead frame 10 is replaced by the interposer 60.

To be more specific, the relay member 100 and the semiconductor chip 20 are mounted on one surface of the interposer 60, and one end 42 of the first wire 40 is bonded to the electrode 62 (such as land) formed on one surface of the interposer 60. In addition, the interposer 60 has on its opposite plane the external terminal 64, such as solder balls. On one surface of the interposer 60 is the sealing plastics resin 50, which seals the relay member 100, the semiconductor chip 20, the first wire 40, the second wire 30, and the electrode 62.

This embodiment produces the same effect as the first embodiment.

Figure 15:
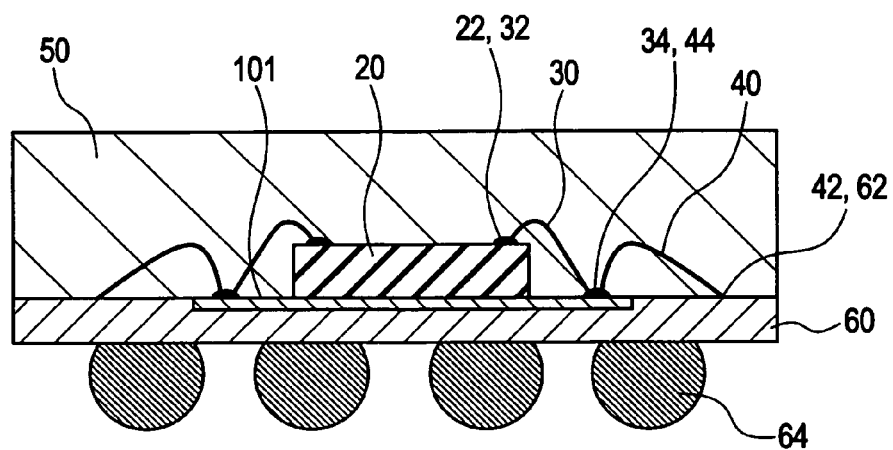
FIG. 15 is a sectional view showing the structure of the electronic device pertaining to a seventh embodiment.

FIG. 15 is a sectional view showing the structure of the electronic device pertaining to the seventh embodiment. The electronic device pertaining to this embodiment is identical with the one pertaining to the sixth embodiment except that the relay member 100 is replaced by the relay region 101.

The relay region 101 exists on one surface of the interposer 60. It is formed from a plastics resin containing metal particles 103 dispersed therein (see the second embodiment), which is applied onto a specific region in one surface of the interposer 60. It may be replaced by the metal pieces 102 shown in the first embodiment. In this case, the metal pieces 102 are formed at the same time when the electrode 62 is formed. According to this embodiment, the relay region 101 is formed in that region (and periphery thereof) of one surface of the interposer 60 on which the semiconductor chip 20 is mounted. However, it may be formed only in the periphery of the region on which the semiconductor chip 20 is mounted.

Moreover, the semiconductor chip 20 is mounted on one surface of the interposer 60 without the relay member 100 interposed between them.

This embodiment produces the same effect as the sixth embodiment. In addition, the fact that the relay member 100 is not necessary helps reduce the thickness of the semiconductor device and the cost for manufacturing of the semiconductor device.

Figure 16:
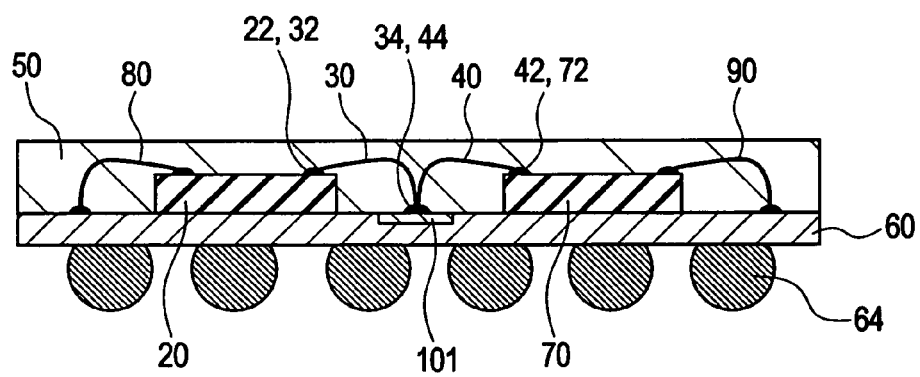
FIG. 16 is a sectional view showing the structure of the electronic device pertaining to an eighth embodiment.

FIG. 16 is a sectional view showing the structure of the electronic device pertaining to the eighth embodiment. According to this embodiment, the semiconductor chips 20 and 70 are mounted on one surface of the interposer 60, and they are connected to each other through the second wire 30 and the first wire 40.

To be more specific, the relay region 101 is placed between two regions of the surface of the interposer 60, one being that part in which the semiconductor chip 20 is mounted and the other being that part in which the semiconductor chip 70 is mounted. The relay region 101 is identical in structure with that in the seventh embodiment. The second wire 30 has its one end 32 connected to the electrode pad 22 of the semiconductor chip 20, and the first wire 40 has its one end 42 connected to electrode pad 72 of the semiconductor chip 70. The first wire 40 and the second wire 30 have their respective other ends 44 and 34 joined to each other, and at least either of them is joined to the metal of the relay region 101.

In addition, the interposer 60 and the semiconductor chip 20 are joined to each other through the wire 80, and the interposer 60 and the semiconductor chip 70 are joined to each other through the wire 90. On one surface of the interposer 60 is the sealing resin 50, which seals the relay region 101, the semiconductor chips 20 and 70, the first wire 40, the second wire 30, and the wires 80 and 90. Incidentally, on the opposite side of the interposer 60 is the external terminal 64, such as solder ball.

According to this embodiment, the wire to connect the semiconductor chips 20 and 70 together is divided into two sections. This prevents the adjacent wires from suffering short-circuiting when the sealing resin 50 flows even though the semiconductor chips 20 and 70 are away from each other. Moreover, the fact that the relay region 101 is arranged on one surface of the interposer 60 helps make the semiconductor chip thinner than in the case where the relay member is employed.

Incidentally, according to this embodiment, it is desirable that both the first wire 40 and the second wire 30 have their one ends 32 and 42 connected respectively to the electrode pads 22 and 72 after they have their other ends 34 and 44 connected to the relay region 101. It is also desirable that both of the wires 80 and 90 are connected to the semiconductor substrates 20 and 70 after they have been connected to the interposer 60. In this way it is possible to lower the apexes of the first wire 40, the second wire 30, and the wires 80 and 90. This helps reduce further the thickness of the electronic device.

The embodiments of the present invention have been described above with reference to the accompanying drawings. However, they are merely examples of the present invention and they may be variously modified.

For example, the first to seventh embodiments are not restricted in the order of connection of the first wire 40 and the second wire 30 as specified in the first embodiment. The order may be changed such that the first wire 40 has its other end 44 connected to the lead 14 and its one end 42 connected to the relay member 100 or the metal in the relay region 101 and then the second wire 30 is arranged. In this case, the other end 34 of the second wire 30 and the other end 44 of the first wire 40 are connected to each other and then one end 32 of the second wire 30 is connected to the electrode pad 22. This is desirable for the throughput of the electronic device.

Moreover, in each of the foregoing embodiments, the first and second wires 40 and 30 need not to be cut on the relay member 100 or the relay region 101 when they are arranged. Notwithstanding this procedure, the first and second wires 40 and 30 are provided in the finished state.

Also, in the eighth embodiment, the relay region 101 may be replaced by the relay member 100.

Also, according to the present application, the invention described below is also available.

A method for manufacturing an electronic device, comprising:

a step of arranging a first electronic part having a first external connecting terminal and a second electronic part having a second external connecting terminal, the second electronic part not overlapping with the first external connecting terminal in the plan view;

a step of forming a relay region between the first external terminal and the second electronic part, the relay region having at least on its surface a plurality of metal pieces insulated from one another;

a step of connecting one end of a first wire to the first external connecting terminal, connecting one end of a second wire to the second external connecting terminal, joining at least each of other ends of the first wire and the second wire to at least one of the metal pieces existing in the relay region, and joining the other end of the first wire and the other end of the second wire to each other in the relay region; and a step of sealing with a plastics resin the first electronic part, the second electronic part, the relay region, the first wire, and second wire.

What is claimed is:

1. An electronic device, comprising:
    a first electronic part comprising a first external connecting terminal;
    a second electronic part comprising a second external connecting terminal, the second electronic part not overlapping with the first external connecting terminal in a plan view;
    a relay region at least part of which is positioned between the second electronic part and the first external connecting part in the plan view, the relay region comprising a plurality of mutually insulated metal pieces on a surface thereof;
    a first wire which has its one end connected to the first external terminal and its other end positioned in the relay region;
    a second wire which has its one end connected to the second external terminal and its other end positioned in the relay region; and
    a sealing plastics resin that seals the first electronic part, the second electronic part, the relay region, the first wire, and the second wire,
    wherein at least one of the first wire and the second wire has its other end joined to at least one of the metal pieces, and
    wherein the other end of the first wire and the other end of the second wire are joined together in the relay region.

2. The electronic device according to claim 1, wherein each of the metal pieces is smaller than the other end of the first wire and the other end of the second wire in the plan view.

3. The electronic device according to claim 1, wherein the relay region comprises a substrate of insulating material and dotlike metal pieces patterned on the substrate.

4. The electronic device according to claim 1, wherein the relay region comprises a substrate of insulating material and metal particles dispersed in the substrate, with the metal particles at least partly exposing themselves from a surface of the substrate.

5. The electronic device according to claim 4, further comprising a conductive film of metal which is formed on a portion of the particles which exposes itself from the surface of the substrate, the metal being capable of alloying more easily with the first and second wires than with a metal forming the metal particles.

6. The electronic device according to claim 1, further comprising a relay member comprising the relay region on a surface thereof,
    wherein the relay member is larger than the second electronic part in a planar shape,
    wherein the second electronic part is arranged on the relay member, and
    wherein the relay region is arranged in a region of the relay member where at least the second electronic part is not arranged.

7. The electronic device according to claim 6, wherein the first external connecting terminal is formed on the first surface of the first electronic part and the relay member is arranged in a region of the first surface of the first electronic part which does not overlap with the first external connecting terminal in the plan view.

8. The electronic device according to claim 1, further comprising a relay member comprising the relay region on a surface thereof,
    wherein the relay member is arranged between the first external connecting terminal and the second electronic part.

9. The electronic device according to claim 1, wherein the relay region comprises one part of the first surface of the first electronic part.

10. The electronic device according to claim 1, wherein the first electronic part comprises a lead frame, and
    wherein the second electronic part comprises a semiconductor chip.

11. The electronic device according to claim 1, wherein the first electronic part comprises an interposer, and
    wherein the second electronic part comprises a semiconductor chip.

12. The electronic device according to claim 1, wherein the first electronic part comprises a first semiconductor chip,
    wherein the second electronic part comprises a second semiconductor chip,
    wherein the electronic device further comprises a substrate on which the first semiconductor chip and the second semiconductor chip are mounted, and
    wherein the relay region is positioned between the first semiconductor chip and the second semiconductor chip.

13. The electronic device according to claim 1, wherein the second wire comprises Au, Cu, or Al, and
    wherein the metal comprises at least a surface layer of one of Au, Al, Pd, Ag, Sn, and Cu, or an alloy mainly comprising any of Au, Al, Pd, Ag, Sn, and Cu.

14. A relay member for connection with a wire between a first external connecting terminal of a first electronic part and a second external connecting terminal of a second electronic part, the relay member comprising:
    a substrate at least a surface of which has insulating properties;
    a plurality of metal pieces separated from one another which exist on at least part of the surface of the substrate; and
    metal particles dispersed in the substrate, with the metal particles at least partly exposing from the surface of the substrate.

15. The relay member according to claim 14, wherein the metal pieces are formed in a dotted pattern on the substrate.

16. The relay member according to claim 14, further comprising:
    a conductive film which is formed on a part of a portion of the metal particles which exposes itself from the surface of the substrate, the conductive film comprising a metal capable of alloying more easily with the first and second wires than with a metal constituting the metal particles.

17. A mounting substrate on which a first electronic part is to be mounted, said mounting substrate comprising:
    a first mounting region in which the first electronic part is to be mounted;

a terminal region which is formed at a place different from that of the first mounting region in a plan view and which comprises a connecting terminal to be connected to the first electronic part through a wire; and a relay region which is positioned between the first mounting region and the terminal region and comprises on its surface a plurality of metal pieces insulated from one another.

18. The mounting substrate according to claim 17, wherein the connecting terminal is arranged in the terminal region of the mounting substrate.

19. The mounting substrate according to claim 17, wherein the terminal region comprises a second mounting region in which a second electronic part is mounted, and wherein the connecting terminal comprises an external connecting terminal which the second electronic part possesses.

20. An electronic device, comprising:

a first electronic part comprising a first external connecting terminal, a semiconductor chip comprising a second external connecting terminal, the semiconductor chip not overlapping with the first external connecting terminal in a plan view;

a relay member comprising a first relay region on a surface thereof, the first relay region comprising a plurality of mutually insulated metal pieces;

a first wire which has its one end connected to the first external terminal and its other end positioned in the first relay region;

a second wire which has its one end connected to the second external terminal and its other end positioned in the first relay region; and a sealing plastics resin that seals the first electronic part, the semiconductor chip, the relay region, the first wire, and the second wire, wherein the plurality of mutually insulated metal pieces comprises a first metal piece and a second metal piece, and wherein at least one of the first wire and the second wire has its other end joined to both of the first metal piece and the second metal piece, and wherein the other end of the first wire and the other end of the second wire are joined together on the first relay region.

21. The electronic device according to claim 20, further comprising;

a third external connecting terminal formed on the first electronic part;

a fourth external connection terminal formed on the semiconductor chip;

a second relay region on a surface of the relay member, the second relay region comprising a plurality of mutually insulated metal pieces;

a third wire which has its one end connected to the third external terminal and its other end positioned in the second relay region; and a fourth wire which has its one end connected to the fourth external terminal and its other end positioned in the second relay region, wherein the plurality of mutually insulated metal pieces on the second relay region comprises a third metal piece and a fourth metal piece, wherein at least one of the third wire and the other end of the fourth wire has its other end joined to both of the third metal piece and the fourth metal piece, and wherein the other end of the third wire and the other end of the fourth wire are joined together on the second relay region.

22. The electric device according to claim 21, wherein the relay member further comprises a fifth metal piece on an area between the first relay region and the second relay region, and wherein the fifth metal piece is not joined to any wires, including the first wire, the second wire, the third wire, and the fourth wire.

23. The electric device according to claim 21, wherein, in a plan view, the first metal piece and the second metal piece are smaller than the other end of the first wire and the other end of the second wire.

24. The electric device according to claim 20, wherein the plurality of mutually insulated metal pieces is smaller in size than a diameter of the first wire.

25. The electric device according to claim 24, wherein an interval of the plurality of mutually insulated metal pieces is less than a diameter of the first wire.

* * * * *